(12) United States Patent
Bousseton et al.

(10) Patent No.: US 10,172,260 B2
(45) Date of Patent: *Jan. 1, 2019

(54) METHOD TO INCREASE SERVER'S DENSITY IN DATACENTER

(71) Applicant: International Business Machines Corporation, Armonk, NY (US)

(72) Inventors: Sebastien Bousseton, Saint-Jeannet (FR); Arnaud Lund, Cagnes-sur-mer (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/846,293

(22) Filed: Dec. 19, 2017

(65) Prior Publication Data
US 2018/0110155 A1  Apr. 19, 2018

Related U.S. Application Data

(60) Continuation of application No. 15/486,377, filed on Apr. 13, 2017, now Pat. No. 9,894,806, which is a
(Continued)

(30) Foreign Application Priority Data

Jul. 31, 2009 (EP) .................. 09305725

(51) Int. Cl.
*H05K 7/14* (2006.01)
*H05K 7/20* (2006.01)
*H05K 13/00* (2006.01)

(52) U.S. Cl.
CPC ....... *H05K 7/20709* (2013.01); *H05K 7/1488* (2013.01); *H05K 7/20736* (2013.01);
(Continued)

(58) Field of Classification Search
CPC .......... H05K 7/20836; H05K 13/0023; H05K 13/00; H05K 7/20745; H05K 7/20709; H05K 7/1488; Y10T 29/49826
See application file for complete search history.

(56) References Cited

U.S. PATENT DOCUMENTS 9,282,683 B2   3/2016   Bousseton et al.
9,549,489 B2   1/2017   Bousseton et al.
(Continued)

FOREIGN PATENT DOCUMENTS

JP   11020913 A   1/1999

OTHER PUBLICATIONS

Office Action (dated Dec. 17, 2014) for U.S. Appl. No. 13/376,695, filed Dec. 17, 2011, Conf. No. 7578.
(Continued)

*Primary Examiner* — Sarang Afzali
*Assistant Examiner* — Ruth G Hidalgo-Hernandez
(74) *Attorney, Agent, or Firm* — Schmeiser, Olsen & Watts, LLP; Mark Vallone

(57) ABSTRACT

A method. A cooling fluid flows through a flexible tube into each rack container including a plurality of rack units via a cooling conduit that encapsulates the flexible tube and is secured at a first port on a top surface of each rack container. The rack units are stacked in a direction parallel to a floor. The cooling conduit includes a first segment, a second segment, and a third segment. The first segment is linked to, perpendicular to, and in direct physical contact with, the second segment through a first articulation. The second segment is linked to, parallel to, and in direct physical contact with, the third segment through a second articulation. The first and second articulations are configured to rotate horizontally in a plane parallel to the floor to enable
(Continued)

the flexible tube to maintain smooth contact with the top surface of each rack container.

12 Claims, 7 Drawing Sheets

Related U.S. Application Data continuation of application No. 15/374,061, filed on Dec. 9, 2016, now Pat. No. 9,706,686, which is a continuation of application No. 14/989,423, filed on Jan. 6, 2016, now Pat. No. 9,549,489, which is a division of application No. 13/376,695, filed as application No. PCT/EP2010/057592 on Jun. 1, 2010, now Pat. No. 9,282,683.

(52) U.S. Cl.
CPC ..... *H05K 7/20745* (2013.01); *H05K 7/20836* (2013.01); *H05K 13/00* (2013.01); *Y10T 29/49826* (2015.01)

(56) References Cited

U.S. PATENT DOCUMENTS

| | | |
|---|---|---|
| 2003/0150231 A1 | 8/2003 | Spinazzola et al. |
| 2004/0029617 A1 | 2/2004 | Flynn |
| 2007/0167125 A1 | 7/2007 | Rasmussen et al. |
| 2008/0305731 A1 | 12/2008 | Reid et al. |
| 2009/0021907 A1 | 1/2009 | Mann et al. |
| 2009/0100848 A1 | 4/2009 | Kuriyama et al. |
| 2012/0119632 A1 | 5/2012 | Bousseton et al. |
| 2016/0120074 A1 | 4/2016 | Bousseton et al. |
| 2016/0120078 A1 | 4/2016 | Bousseton et al. |
| 2017/0094838 A1 | 3/2017 | Bousseton et al. |
| 2017/0223873 A1 | 8/2017 | Bousseton et al. |

OTHER PUBLICATIONS

Amendment (dated Mar. 13, 2015) for U.S. Appl. No. 13/376,695, filed Dec. 7, 2011, Conf. No. 7578.
Final Office Action (dated Apr. 29, 2015) for U.S. Appl. No. 13/376,695, filed Dec. 7, 2011, Conf. No. 7578.
RCE (Jul. 23, 2015) for U.S. Appl. No. 13/376,695, filed Dec. 7, 2011, Conf. No. 7578.
Final amendment (dated Jun. 26, 2015) for U.S. Appl. No. 13/376,695, filed Dec. 7, 2011, Conf. No. 7578.
Advisory Action (dated Jul. 9, 2015) for U.S. Appl. No. 13/376,695, filed Dec. 7, 2011, Conf. No. 7578.
Notice of Allowance (dated Nov. 12, 2015) for U.S. Appl. No. 13/376,695, filed Dec. 7, 2011, Conf. No. 7578.
Patent application for U.S. Appl. No. 14/989,326, filed Jan. 6, 2016, Conf. No. 5008.
Notice of Allowance (dated Sep. 8, 2016) for Patent application for U.S. Appl. No. 14/989,423, filed Jan. 6, 2016, Conf. No. 3423.
Notice of Allowance (dated Mar. 2, 2017) for U.S. Appl. No. 15/374,061, filed Dec. 9, 2016.
Office Action (dated Mar. 10, 2017) for U.S. Appl. No. 14/989,326, filed Jan. 6, 2016.
Office Action (dated Jun. 6, 2017) for U.S. Appl. No. 15/486,377, filed Apr. 13, 2017.
Amendment (dated Sep. 5, 2017) for U.S. Appl. No. 15/486,377, filed Apr. 13, 2017.
Notice of Allowance (dated Sep. 22, 2017) for U.S. Appl. No. 15/486,377, filed Apr. 13, 2017.
Notice of Allowance (dated Jun. 26, 2017) for U.S. Appl. No. 14/989,326, filed Jan. 6, 2016.

METHOD TO INCREASE SERVER'S DENSITY IN DATACENTER

This application is a continuation application claiming priority to Ser. No. 15/486,377, filed Apr. 13, 2017, now U.S. Pat. No. 9,894,806, issued Feb. 13, 2018, which is a continuation of Ser. No. 15/374,061, filed Dec. 9, 2016, U.S. Pat. No. 9,706,686, issued Jul. 11, 2017, which is a continuation of Ser. No. 14/989,423, filed Jan. 6, 2016, U.S. Pat. No. 9,549,489, issued Jan. 17, 2017, which is Divisional of Ser. No. 13/376,695 filed Dec. 7, 2011, U.S. Pat. No. 9,282,683, issued Mar. 8, 2016.

TECHNICAL FIELD

The present invention relates generally to datacenter and more particularly to a system to increase server's density in datacenter.

BACKGROUND OF THE INVENTION

A datacenter is a facility used to house computer systems and associated components, such as telecommunications and storage systems. It generally includes redundant or backup power supplies, redundant data communications connections, environmental controls (air conditioning, fire suppression, etc.), and special security devices. Datacenters concentrate large numbers of processing systems within a small area in order to provide an efficient and optimal environment to operate the systems. Power, cooling and other management services can be provided more efficiently in a datacenter than if the systems were decentralized.

Continuing demands for increasing processing system capacity require that the datacenter must be designed for efficient power management, thermal management, configurational flexibility, and maintenance. These competing design considerations have led to the development of numerous systems, but the most common of these systems include the use of racks that support large numbers of components and are arranged side by side in rows.

In a typical datacenter as illustrated on FIG. 1, adjacent rack rows are placed face to face or back to back in order to create alternate hot aisles and cold aisles. Cold air pushed in the raised floor by the cooling system is supplied in the cold aisles in between of to adjacent rack rows facing each other through perforated floor tiles. Cold air is collected by the cooling fans of equipment in the racks and is expulsed at the back of the rack row in the hot aisles where two adjacent rack rows are back to back. Hot air is collected in the ceiling and circulates back to the cooling system. Alternating hot and cold aisles enable relatively efficient air flow management and cooling, while providing access aisles along the front and back of each row of racks to facilitate installation, reconfiguration and maintenance.

The aisles between the racks have a second function which is to allow personal circulation between the racks to gain access to the equipment for installation and maintenance operations.

Buildings are expensive, and machine room space is costly for companies. There is always the concern to reduce this cost by increasing as much as possible the number of machines contained in a given room (the "equipment density" of the room) to gain cost efficiency.

With the common room design as described above, one can noticed that although efficient, there is still a lot of space that is not used for host equipment. Overall it is around 30% and up to 50% of the floor space that is not used and cannot be used, as all the aisles, either hot or cold are and must remain free.

However, there remains the need for even more efficient rack systems that make more efficient use of the space in a given datacenter while providing thermal management and configurational flexibility.

It would be desirable to have more efficient rack systems that utilize many standardized components, such as motherboards, hard disk drives, and PCI cards.

It would be even more desirable to have rack systems that increase the density of the processing system without overloading existing cooling systems.

The present invention offers such solution.

SUMMARY OF THE INVENTION

The shortcomings of the prior art are overcome and additional advantages are provided through the provision of the system of the present invention. The system is made of a mobile closed container that comprises flexible tubes for power distribution, network connection and air circulation within the container.

Accordingly, a first object of the invention is to provide a moveable container including one or more racks locations to house a plurality servers. The container is closed to have an inside air circulation to cool the equipment of the racks.

The moveable container is further equipped with wheels to allow easy moving of the container.

The moveable container also supplied in network connection, power distribution, and air circulation with a flexible arrangement.

It is another object of the invention to provide a datacenter structure having an increased density of servers in the machine room.

Yet another object of the invention is to provide a datacenter wherein all rack containers are placed aside each other without the need to keep free aisles between the racks rows.

The present invention provides a system that offers an easy accessibility to racks for maintenance purpose in a dense machine room. The mobility of the system of the invention allows removing free corridors previously required for maintenance and security access.

A major advantage of the system of the present invention is to allow a better optimization of the space used in a datacenter.

Accordingly, there is provided a system as further described in the appended independent claim.

In a preferred embodiment, a container for housing one or more heat generating components comprises supplying means secured at an inner port of the container for supplying at least a cooling material inside the container to cool the heat generating components, and exhausting means having one end secured at an outer port for exhausting hot material resulting from the cooling material passing through the container. The container is further equipped with moving means secured to the container to allow displacement of the container. The supplying and exhausting means comprise flexible extensible portions adapted to flexibly extend when moving the container.

Further embodiments are described in the appended dependent claims.

Further aspects of the invention will now be described, by way of preferred implementation and examples, with reference to the accompanying figures.

BRIEF DESCRIPTION OF THE DRAWINGS

The above and other items, features and advantages of the invention will be better understood by reading the following more particular description of the invention in conjunction with the accompanying drawings wherein.

DETAILED DESCRIPTION OF THE INVENTION

Embodiments of the invention are described herein after by way of examples with reference to the accompanying figures and drawings.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. In one embodiment, an electronics rack may comprise multiple electronics subsystems, each having one or more heat generating components disposed therein requiring cooling. "Electronics subsystem." refers to any sub-housing, blade, book, drawer, node, compartment, etc., having one or more heat generating electronic components disposed therein. Each electronics subsystem of an electronics rack may be movable or fixed relative to the electronics rack, with the electronics drawers of a multi-drawer rack unit and blades of a blade center system being two examples of subsystems of an electronics rack to be cooled.

Reference is made below to the drawings, which are not drawn to scale for reasons of understanding, wherein the same reference numbers used throughout different figures designate the same or similar components.

Figure 1:
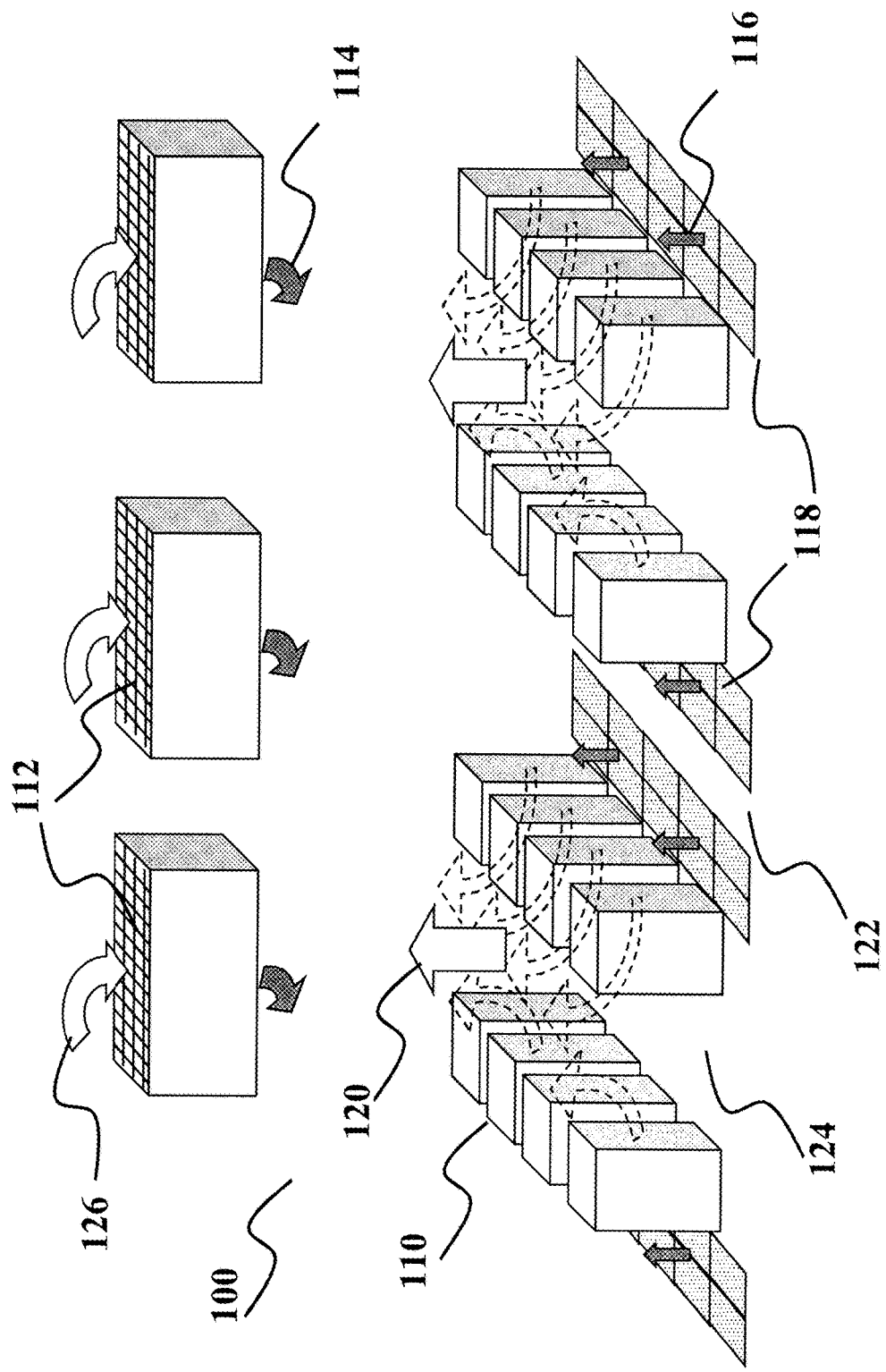
FIG. 1 is a schematic perspective view of a prior art datacenter.

FIG. 1 depicts one embodiment of datacenter room layout 100 typical of the prior art. In this layout, multiple electronics racks 110 are disposed in one or more rows. A computer installation such as depicted in FIG. 1 may house several hundred, or even several thousand, microprocessors. One or more cooling units (112) push chilled air (114) into a raised floor. Air (116) goes out of the raised floor through perforated tiles (118) located at the front of the rack rows. Chilled air is pulled into the racks by equipment ventilation and goes out as hot air (120) at the back of the rack rows and then is collected in the ceiling. The machine room is organized with cold aisles (122) and not aisles (124) to avoid the mixing of not and cold air flows which would reduce the cooling efficiency. The hot air (126) is ultimately pumped by the cooling units (112) and cooled again for a new cycle.

Figure 2:
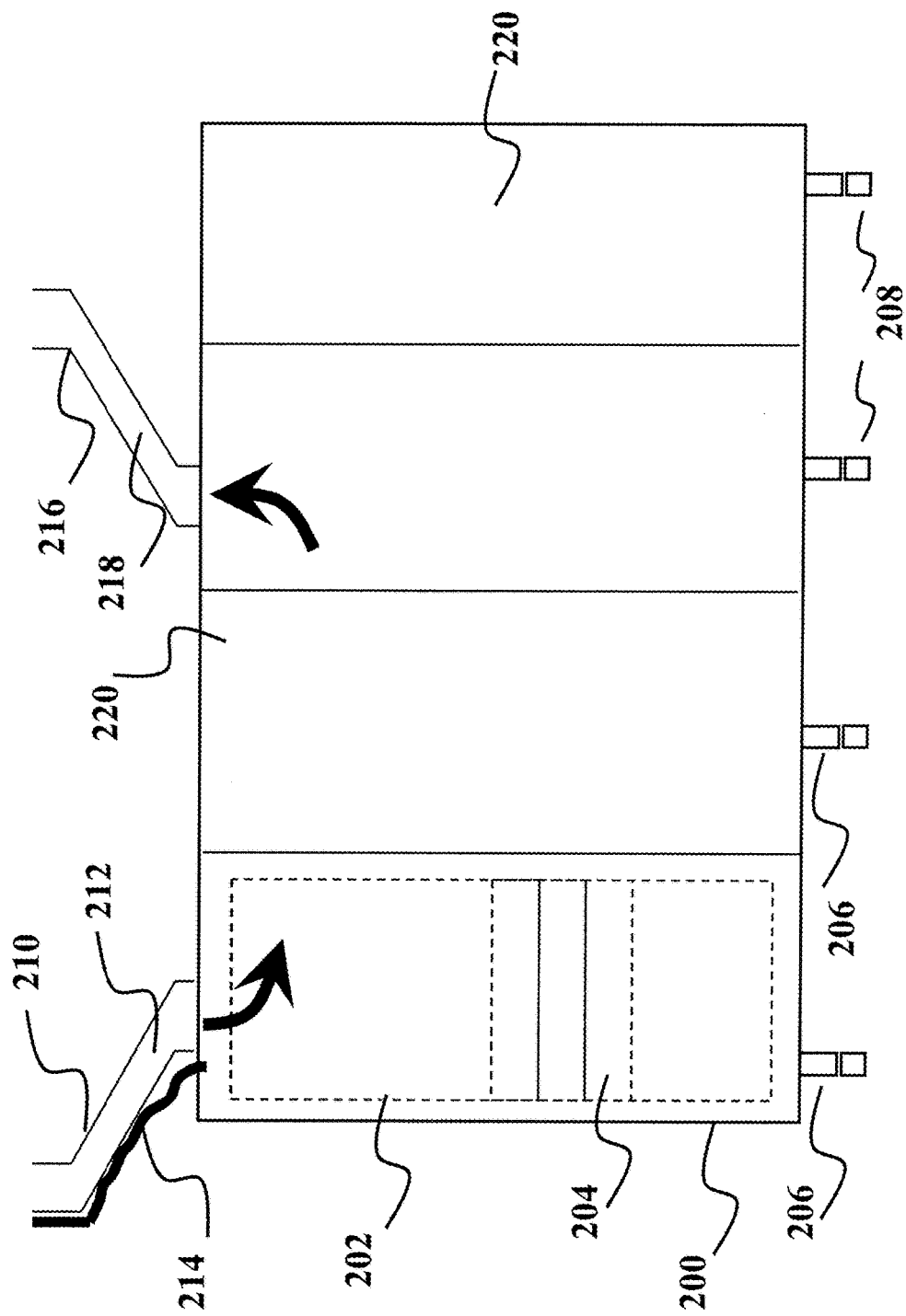
FIG. 2 is a schematic front view of a rack container in a preferred embodiment of the present invention.

With reference to FIG. 2, there is depicted a front view of a rack container (200) as used in a preferred embodiment of the present invention. The rack container (200) allows housing a plurality of rack units (202). Several types of heat generating devices (204) (e.g. servers, routers . . . ) may be placed in each rack unit (202). Each heat generating device (204) generates heat while in operation. The rack container (200) is further equipped with wheels (206). The wheels are adapted to roll on a supporting structure (208) such as rails in the floor.

An air supplying conduit (210) is a cooling conduit that is secured at an inner port on a top surface of the rack container allowing cooling material (i.e., a cooling fluid) such as cold air (212) to enter the rack container (200) via the cooling conduit and pass through to cool the internal components. The top surface of the rack container (200) is a surface that is further from the floor than is any other surface of the rack container (200). The cooling material is configured to be heated by absorbing heat from the heat generating device (204). The air supplying conduit is preferably a flexible extensible tube as it will be detailed later with reference to FIGS. 4 and 5.

Power supply and network connections are provided on a flexible power and network cable (214) which enters the rack container at an inner power and inner network ports to supply power to the heat generating devices (204). In the preferred embodiment, the inner power and network ports are located on the upper side of the rack container, but any alternative that would not prevent displacement of the rack container may be devised.

An exhaust air conduit (216) is an exhaust conduit that is secured at an outer port on a top surface of the rack container allowing the heated cooling fluid such as hot air (218) to exhaust from the rack container (200). The exhaust air conduit is preferably a flexible extended tube as it will be detailed later with reference to FIGS. 4 and 5.

For clarity reasons only one instance of the air supplying conduit (210), the flexible cable (214) and the air exhausting conduit (216) have been represented on FIG. 2, but the person skilled in the art would easily understand that as alternative embodiments, the present invention may comprise several of each such conduits or cable.

The racks container is a closed system to allow the cold and hot air flows inside the container. Referenced by numerals on FIG. 2 but not detailed are sliding doors (220) to open the container to allow access to the equipment (e.g., heat generating devices (204)) located inside the container. Form and size of the doors are not part of the invention which may accommodate to any variation without departing from the scope of the invention.

While the preferred embodiment is described with air being the cooling material (i.e., cooling fluid) flowing through the container to cool the heat generating components, it is not to be interpreted as a limitation and other cooling material may be used as fluid material. Thus in one embodiment, the cooling material is not air. The present invention provides a container for housing heat generating components comprises supplying means secured at an inner port of the container for supplying cooling material inside the container to cool the heat generating components, and exhausting means having one end secured at an outer port for exhausting hot material resulting from the cooling material passing through the container. The container is further equipped with moving means secured to the container to allow displacement of the container. The supplying and exhausting means comprise flexible extensible portions adapted to flexibly extend when moving the container.

Figure 3:
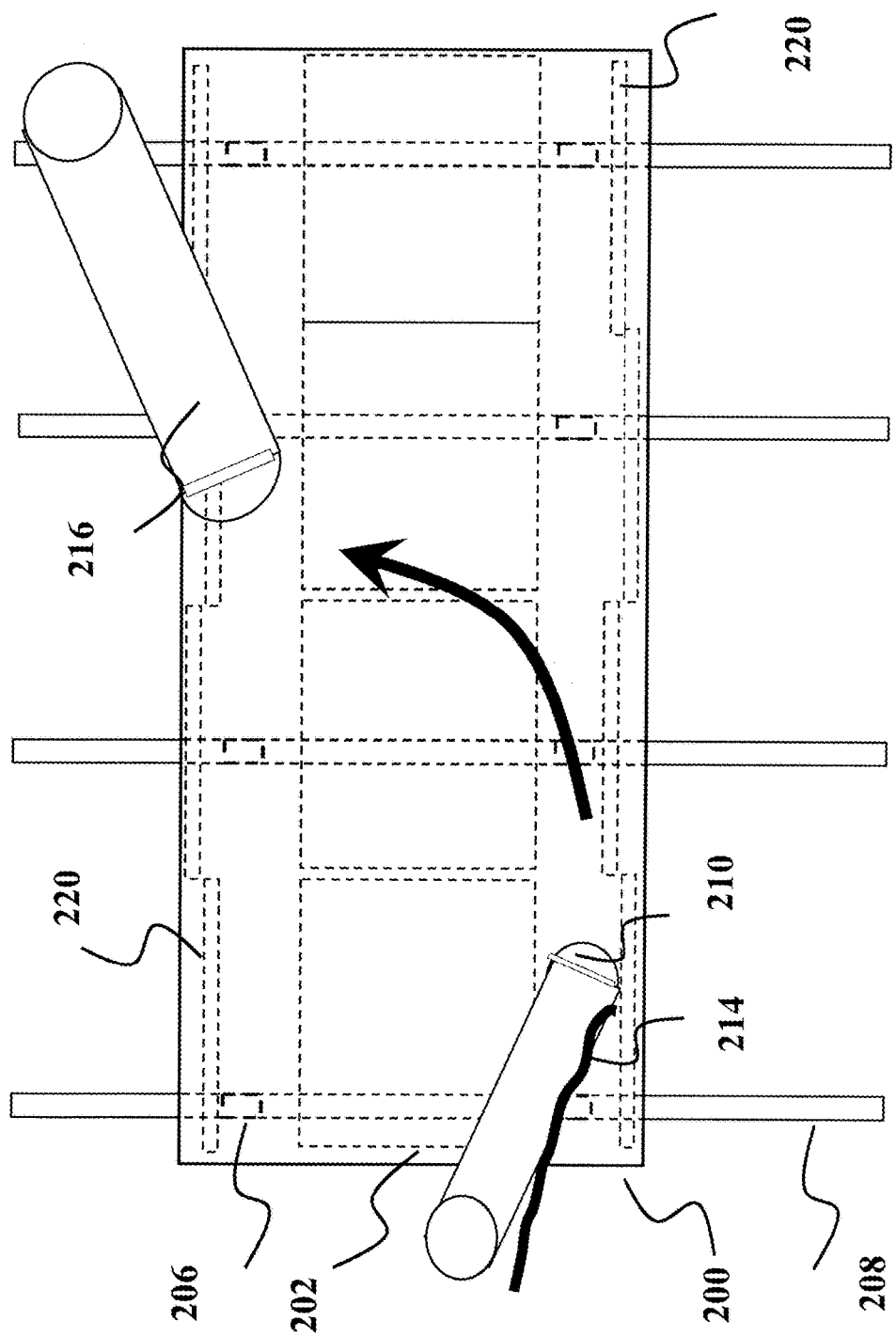
FIG. 3 is a schematic top view of a rack container in a preferred embodiment of the present invention.

Going to FIG. 3, a top view of the rack container of the present invention is shown with same reference numbers for same components as used in FIG. 2. Illustrated on FIG. 3 are locations for the air supplying conduit (210) and the air exhausting conduit (216). In a preferred embodiment, the conduit (210) is located opposite to the air exhausting conduit (216). As exemplified, the air supplying conduit (210) is located at the front side of the rack container to have the arriving cold air naturally flowing through the inside components to cool them. The air exhausting conduit (216) is preferably located at the back side of the rack container to exit hot air.

Figure 4:
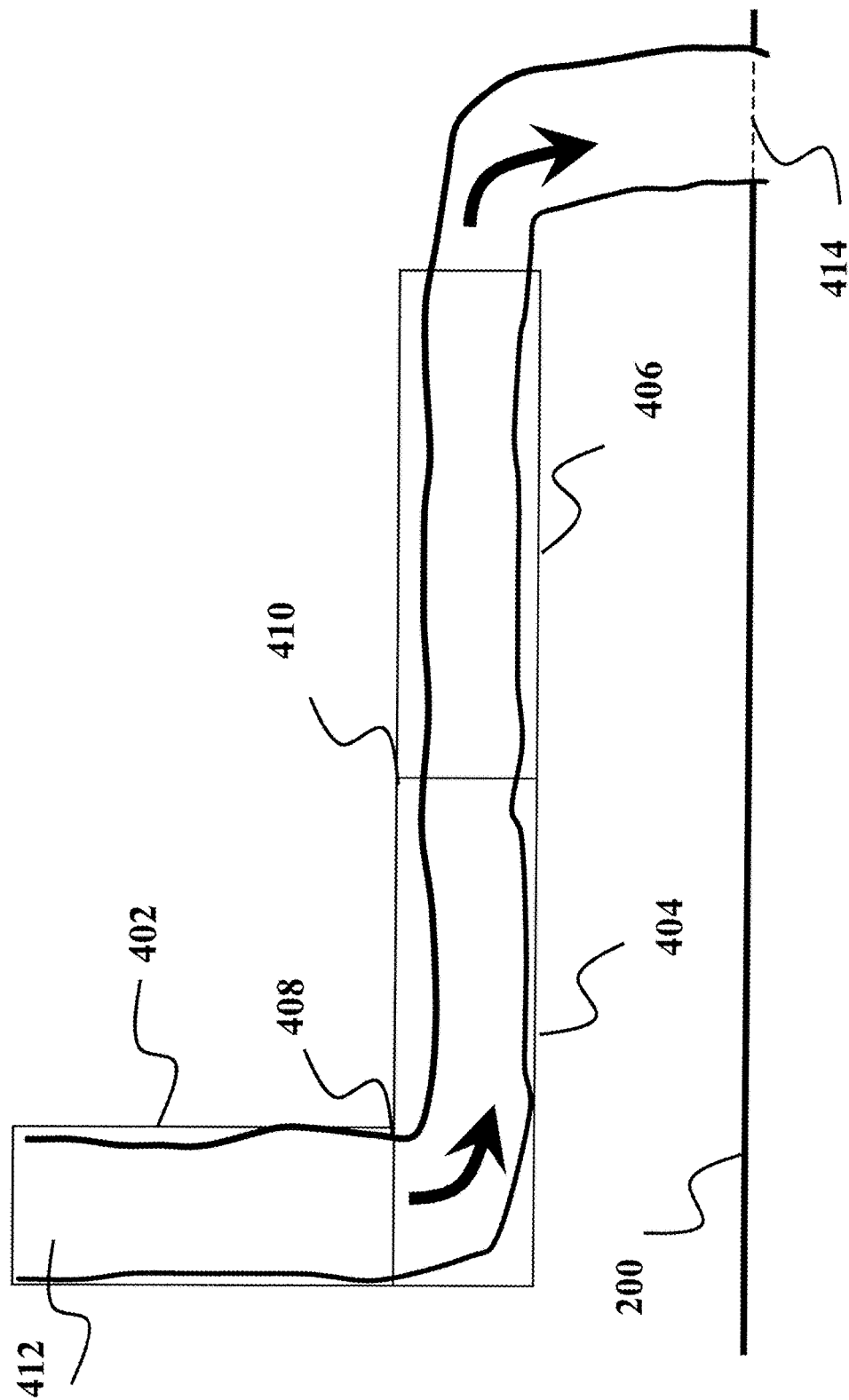
FIG. 4 is a schematic front view of the air supplying conduit in a preferred embodiment of the present invention.

FIG. 4 is a schematic front view of the air supplying conduit in a preferred embodiment of the present invention. The air supplying conduit comprises an articulated arrangement (402, 404, 406) which encapsulates a flexible tube (412). The articulated arrangement comprises a first segment (402) linked to a second segment (404) through a first articulation (408). The second segment (404) is linked to a third segment (406) through a second articulation (410). The first and the second articulations (408, 410) are chosen to allow horizontal rotations of the first and the second articulations (408, 410) (i.e., rotations in a plane parallel to the floor) to enable the flexible tube to maintain smooth contact with the top surface of the rack container (200), as it will be further detailed in FIG. 5. It will be appreciated that the size and length of the segments may vary depending on several factors such as the size of the machine room, the size of the racks container and so without departing from the scope of the present invention. The articulated conduit allows to encapsulate a portion of the flexible tube (412) in which the arriving cooling air flows. The flexible tube is secured to the rack container (200) an air supplying port (414).

Figure 5:
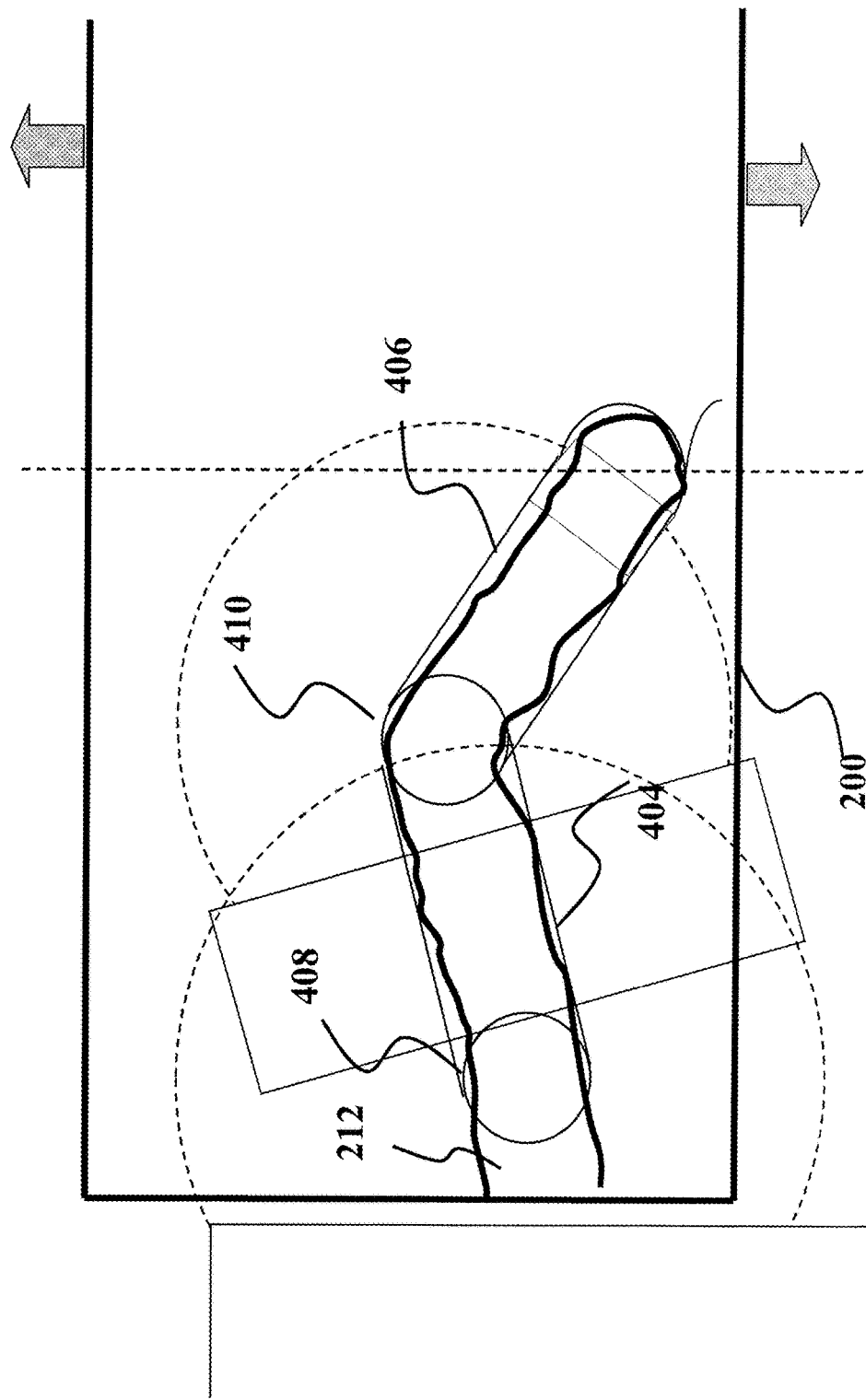
FIG. 5 is a schematic top view of the air supplying conduit in a preferred embodiment of the present invention.

Going to FIG. 5 a schematic top view of the air supplying conduit in a preferred embodiment of the present invention is presented.

As already mentioned, the air conduit includes an articulated arm to allow easy moving of the racks container. The doted circles shown on FIG. 5 exemplify tie rotations of the articulations (408, 410) thereby allowing the flexible tube to keep smooth contact during the rack container displacement.

It is to be appreciated that while the air supplying conduit has been shown and described herein, the same structure may apply to the air exhausting conduit. The two conduits may be either strictly identical conduits in size, form and material or may have respectively any variation in one or more of those parameters.

Figure 6:
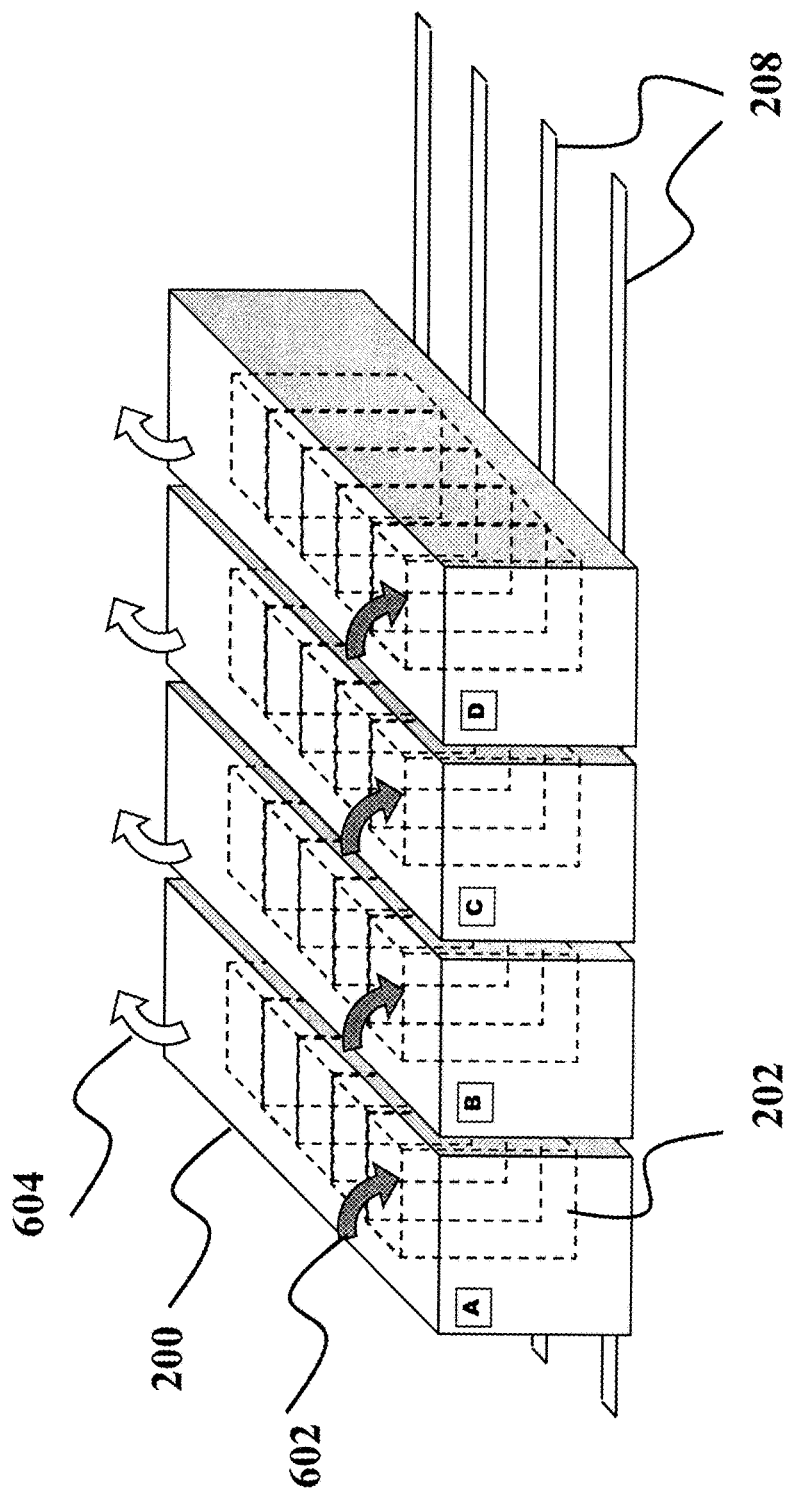
FIG. 6 is a schematic perspective view of a datacenter in accordance with a preferred embodiment of the racks containers of the present invention.

FIG. 6 is a schematic perspective view of a datacenter in accordance with a preferred embodiment of the present invention. For simplicity only four racks containers (A, B, C, D) are shown but this is not to be interpreted as a limitation of the layout of datacenters implementing the racks containers of the present invention. In one embodiment, the datacenter may include a plurality of rack containers (e.g., A, B, C, D). Grey arrows illustrate the cool arriving air flows (602) while blank arrows illustrate the hot exit air flows (604) collected within each individual racks container. For clarity of the figure, the flexible tubes and the air conduits are omitted on each racks container. The benefit of the present invention becomes apparent as allowing pushing each racks container close together, side by side. Instead of losing free space as with previous layouts, mainly space lost for the hot aisles and the cold aisles, there remains only the need to keep free the place for the displacement of one rack container. The density of datacenters using the structure of racks containers of the present invention is much higher than with commons machine rooms design.

Figure 7:
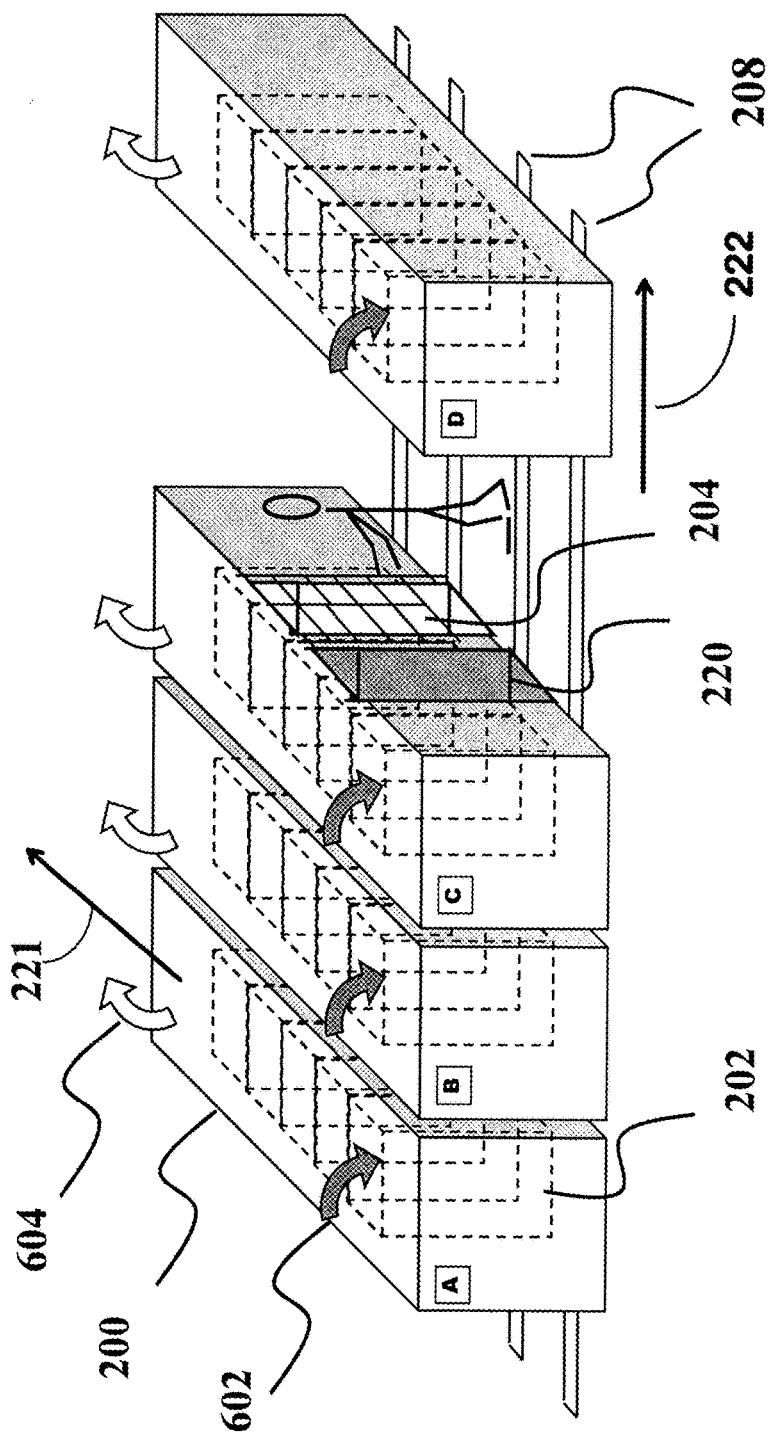
FIG. 7 is a schematic perspective view of a datacenter in accordance with a preferred embodiment of the racks containers of the present invention in a maintenance mode.

FIG. 7 is a schematic perspective view of a datacenter in accordance with a preferred embodiment of the racks containers of the present invention in a maintenance mode. In any case of failure or alert detected on one rack inside a rack container (A, B, C, C) that requires a maintenance operation is easy to handled with the present structure as illustrated by the operator accessing a failed rack in container C. In the proposed example, container D is moved along the rails (208) to free space between containers C and D thereby getting access to the respective failed rack in container C. The rack units (202) are stacked in a direction 221 that is parallel to the floor. The rails (208) are oriented in a direction 222 that is parallel to the floor and is perpendicular to the direction 221. The wheels (206) (see FIG. 2) positioned on the supporting structure (e.g., rails 208) are configured to move along the supporting structure in the direction 222 to enable adjacent rack containers (e.g., C and D) to move closer to or further from each other. The cooling conduit (210) and the exhaust conduit (216) of each rack container (200) are configured to flexibly extend in response to each rack container (200) moving along the supporting structure in the direction 222. The operator then opens the rack door (220) and gains access to the inside equipment (204). In alternate embodiments, additional grips may be secured to the container to facilitate the container movement.

The present invention provides a system. The system comprises a plurality of rack containers and a cooling conduit. Each rack container comprises a plurality of rack units. The rack units are stacked in a first direction that is parallel to a floor. Each rack unit comprises at least one heat generating device. Each heat generating device is configured to generate heat while in operation. Each rack container is equipped with wheels positioned on a supporting structure to enable the wheels to move along the supporting structure in a second direction, which enables adjacent rack containers of the plurality of rack containers to move closer to or further from each other. The second direction is parallel to the floor and perpendicular to the first direction. The supporting structure is on the floor and is oriented in the second direction.

The cooling conduit is secured at a first port on top surface of each rack container to allow a cooling fluid to flow into said each rack container via the cooling conduit. The top surface is further from the floor than is any other surface of said each rack container. The cooling fluid is configured to be heated absorbing heat from the at least one heat generating device.

The present invention provides a method for forming a system.

The method comprises providing a plurality of rack containers. Each rack container comprises a plurality of rack units. The rack units are stacked in a first direction that is parallel to a floor. Each rack unit comprises at least one heat generating device. Each heat generating device is configured to generate heat while in operation. Each rack container is equipped with wheels.

The method further comprises positioning the wheels on a supporting structure to enable the wheels to move along the supporting structure in a second direction, which enables adjacent rack containers of the plurality of rack containers to move closer to or further from each other. The second direction is parallel to the floor and perpendicular to the first direction. The supporting structure is on the floor and oriented in the second direction.

The method further comprises securing a cooling conduit at a first port on a top surface of each rack container to allow a cooling fluid to flow into said each rack container via the cooling conduit. The top surface is further from the floor than is any other surface of said each rack container. The cooling fluid is configured to be heated by absorbing heat from the at least one heat generating device.

It has to be appreciated that while the invention has been particularly shown and described with reference to a preferred embodiment, many various chancres in form and detail may be made therein without departing from the spirit, and scope of the invention.

What is claimed is:

1. A method, said method comprising:
   flowing a cooling fluid through a flexible tube into each rack container of a plurality of rack containers, each rack container comprising a plurality of rack units via a cooling conduit that encapsulates the flexible tube and is secured at a first port on a top surface of said each rack container,
   wherein the rack units of the plurality of rack units are stacked in a first direction that is parallel to a floor,
   wherein the cooling conduit comprises a first segment, a second segment, and a third segment,
   wherein the first segment is linked to, perpendicular to, and in direct physical contact with, the second segment through a first articulation,
   wherein the second segment is linked to, parallel to, and in direct physical contact with, the third segment through a second articulation,
   wherein the first and second articulations are configured to rotate horizontally in a plane parallel to the floor to enable the flexible tube to maintain smooth contact with the top surface of said each rack container,
   wherein the cooling conduit of said each rack container is located at a front side of said each rack container, and
   wherein an exhaust conduit of said each rack container is located at a back side of said each rack container.

2. The method of claim 1, wherein each rack unit of the plurality of rack units comprises at least one heat generating device, said method comprising:
   each heat generating device of the at least one heat generating device generating heat while in operation, said cooling fluid being heated by absorbing heat from the at least one heat generating device.

3. The method of claim 2, wherein the exhaust conduit is secured at a second port on the top surface of said each rack container, said method further comprising:
   exhausting the heated cooling fluid from said each rack container via the exhaust conduit.

4. The method of claim 3, said method comprising:
   said each rack container moving along a supporting structure in the first direction and in response, said cooling conduit and said exhaust conduit of said each rack container flexibly extending, wherein the supporting structure is on the floor and oriented in a second direction, and wherein the second direction is parallel to the floor and perpendicular to the first direction.

5. The method of claim 3, wherein the exhaust conduit of said each rack container is physically separated from said each rack unit of the plurality of rack units in said each rack container.

6. The method of claim 2, wherein said each rack unit comprises a door to enable access to the at least one heat generating device in said each rack unit.

7. The method of claim 2, wherein a flexible power and network cable is coupled to said each rack container, said cable configured to supply power to the at least one heat generating device.

8. The method of claim 1, wherein said each rack container is equipped with wheels positioned on a supporting structure to enable the wheels to move along the supporting structure in a second direction which enables adjacent rack containers of the plurality of rack containers to move closer to or further from each other, wherein the second direction is parallel to the floor and perpendicular to the first direction, and wherein the supporting structure is on the floor and oriented in the second direction.

9. The method of claim 8, wherein the supporting structure on the floor comprises rails on the floor.

10. The method of claim 1, wherein the top surface is further from the floor than is any other surface of said each rack container.

11. The method of claim 1, wherein the cooling fluid is air.

12. The method of claim 1, wherein the cooling fluid is not air.

* * * * *